(12) United States Patent
Golovato et al.

(10) Patent No.: US 6,173,673 B1
(45) Date of Patent: Jan. 16, 2001

(54) METHOD AND APPARATUS FOR INSULATING A HIGH POWER RF ELECTRODE THROUGH WHICH PLASMA DISCHARGE GASES ARE INJECTED INTO A PROCESSING CHAMBER

(75) Inventors: Stephen N. Golovato, Lexington; Robert W. Milgate, III, Gloucester; Paul Louis Consoli, Beverly, all of MA (US)

(73) Assignee: Tokyo Electron Limited, Tokyo (JP)

( * ) Notice: Under 35 U.S.C. 154(b), the term of this patent shall be extended for 0 days.

(21) Appl. No.: 09/282,534

(22) Filed: Mar. 31, 1999

(51) Int. Cl.$^7$ .............................. C23C 16/00; H05H 1/00
(52) U.S. Cl. ........................................ 118/723 E; 156/345
(58) Field of Search .................. 118/723 E, 723 AN, 118/727 ER, 727 IR, 728; 156/345

(56) References Cited

U.S. PATENT DOCUMENTS

| 4,728,528 | 3/1988 | Ishihara et al. . |
| 4,759,947 | 7/1988 | Ishihara et al. . |
| 4,778,692 | 10/1988 | Ishihara et al. . |
| 4,784,874 | 11/1988 | Ishihara et al. . |
| 4,792,378 | 12/1988 | Rose et al. . |
| 4,798,165 | 1/1989 | deBoer et al. . |
| 4,801,468 | 1/1989 | Ishihara et al. . |
| 4,818,563 | 4/1989 | Ishihara et al. . |
| 4,853,251 | 8/1989 | Ishihara et al. . |
| 4,897,709 | 1/1990 | Yokoyama et al. . |
| 4,898,118 | 2/1990 | Murakami et al. . |

(List continued on next page.)

FOREIGN PATENT DOCUMENTS

| 0254654 | 1/1988 | (EP) . |
| 0818558A1 | 1/1998 | (EP) . |
| 2181458 | 4/1987 | (GB) . |
| 53-91664 | 11/1978 | (JP) . |
| 60-116126 | 6/1985 | (JP) . |
| 60-98629 | 6/1985 | (JP) . |
| 61-41763 | 2/1986 | (JP) . |
| 63-187619 | 8/1988 | (JP) . |
| 2-234419 | 9/1990 | (JP) . |
| 5-152208 | 6/1993 | (JP) . |
| WO 93/25722 | 12/1993 | (WO) . |

OTHER PUBLICATIONS

Remery, K.P. et al., *Numerical Simulations of the MRC Single–Wafer (PE)CVD Reaction for Ti and TiN Deposition: Phase 2: Parametric Study of the New Reactor Geometry with Multi–Point Injection*, Kramers Laboratorium voor Fysische Technologie, Aug. 22, 1996, no page numbers.

* cited by examiner

Primary Examiner—Gregory Mills
Assistant Examiner—Parviz Hassanzadeh
(74) Attorney, Agent, or Firm—Wood, Herron & Evans LLP

(57) ABSTRACT

A processing system for processing a substrate with a plasma comprises a processing chamber defining a process space including a support structure for supporting a substrate within the process space. A gas inlet in the chamber introduces a process gas into the chamber and a showerhead positioned within the chamber disperses process gas from the inlet. A supply of electrical energy biases the showerhead to form a plasma with process gas dispersed by the showerhead. First and second electrical insulator elements are positioned between the showerhead and the processing chamber, and are operable to electrically insulate the showerhead from the processing chamber. The first and second electrical insulator elements each have a passage therethrough for passing a process gas from the gas inlet through the insulator element and the respective passages of the insulator elements are laterally spaced from each other. A channel is formed in one of the elements and extends between the spaced passages to couple the passages together and form a complete passage through the first and second insulator elements for passing a process gas to the showerhead.

19 Claims, 3 Drawing Sheets

U.S. PATENT DOCUMENTS

| | | |
|---|---|---|
| 4,908,329 | 3/1990 | Kanai et al. . |
| 4,908,330 | 3/1990 | Arai et al. . |
| 4,979,465 | 12/1990 | Yoshino et al. . |
| 4,987,856 | 1/1991 | Hey et al. . |
| 4,998,503 | 3/1991 | Murakami et al. . |
| 5,010,842 | 4/1991 | Oda et al. . |
| 5,018,479 | 5/1991 | Markunas et al. . |
| 5,052,339 | 10/1991 | Vakerlis et al. . |
| 5,061,511 | 10/1991 | Saitoh et al. . |
| 5,173,327 | 12/1992 | Sandhu et al. . |
| 5,178,905 | 1/1993 | Kanai et al. . |
| 5,180,435 | 1/1993 | Markunas et al. . |
| 5,268,034 | 12/1993 | Vukelic . |
| 5,273,588 | 12/1993 | Foster et al. . |
| 5,304,248 * | 4/1994 | Cheng et al. ............ 118/728 |
| 5,342,471 | 8/1994 | Fukasawa et al. . |
| 5,356,476 | 10/1994 | Foster et al. . |
| 5,370,739 | 12/1994 | Foster et al. . |
| 5,433,787 | 7/1995 | Suzuki et al. . |
| 5,434,110 | 7/1995 | Foster et al. . |
| 5,453,124 | 9/1995 | Moslehi et al. . |
| 5,567,243 | 10/1996 | Foster et al. ............ 118/730 |
| 5,589,002 * | 12/1996 | Su ........................ 118/723 E |
| 5,595,606 | 1/1997 | Fujikawa et al. . |
| 5,919,332 * | 7/1999 | Koshiishi et al. ............ 156/345 |

METHOD AND APPARATUS FOR INSULATING A HIGH POWER RF ELECTRODE THROUGH WHICH PLASMA DISCHARGE GASES ARE INJECTED INTO A PROCESSING CHAMBER

FIELD OF THE INVENTION

This invention relates generally to plasma processing in the formation of integrated circuits, and specifically to plasma processing using a parallel plate plasma discharge device, wherein an electrode is insulated from a ground reference using an insulator plate.

BACKGROUND OF THE INVENTION

Gas plasmas are widely used in a variety of integrated circuit (IC) fabrication processes, including plasma etching and plasma deposition applications applied to a semiconductor substrate. Generally, such plasmas are produced within a processing chamber by introducing a low-pressure process gas into the processing chamber and then directing electrical energy into the chamber for creating an electrical field therein. The electrical field creates an electron flow within the chamber which ionizes individual process gas molecules by transferring kinetic energy to the gas molecules through electron-molecule collisions. The electrons of the electron flow are accelerated within the electric field in the processing chamber for efficient ionization of the gas molecules, and the ionized molecules of the process gas and free electrons collectively form what is referred to as a gas plasma or plasma discharge.

The gas plasma created within the processing chamber may be utilized without any additional process gases, such as for etching the exposed surface of a substrate, or it may be used in combination with other selected process gases for depositing various material layers onto a substrate. For example, within an etching process, the ionized plasma particles will generally be positively charged, and the substrate will be negatively biased such that the positive plasma particles are attracted to the substrate surface to bombard the surface and thus etch and remove a layer of material therefrom.

If it is necessary to deposit thin material films or layers onto the substrata, such as to provide conductive and ohmic contacts for IC fabrication, a deposition process, such as chemical vapor deposition (CVD) may be used. In CVD, process gases are pumped into the processing chamber and the gases chemically react proximate the substrate to form reaction by-products which then deposit on the substrate to form the desired material layer. A CVD process using a gas plasma is generally referred to as a plasma-enhanced CVD or PECVD process. PECVD is often used, for example, for lowering the process temperatures and thermal energy that are usually necessary for a proper chemical reaction with standard CVD. In PECVD, electrical energy delivered to form and sustain the plasma reduces the thermal energy necessary for the chemical reaction.

One common hardware configuration for plasma etching and PECVD is referred to as a parallel plate RF discharge device. In such a device, a planar substrate support and a planar gas supply element, such as a showerhead, are oriented generally parallel with each other in a processing chamber. One or both of the electrodes are electrically biased with RF energy to operate as opposing RF electrodes for energizing one or more of the process gases into an ionized plasma. The distance between the electrodes is relatively small with respect to the dimensions of the electrodes, and the distance may be around 1 inch, for example. The process gas is introduced through small holes within the showerhead electrode, and RF power is applied to the showerhead, requiring that the showerhead be insulated from any ground reference. One such PECVD process and showerhead structure is disclosed in U.S. Pat. No. 5,567,243, which is commonly owned with the present application. Another suitable showerhead structure is disclosed in U.S. Ser. No. 08/940,779, entitled "Apparatus and Method for Preventing the Premature Mixture of Reactant Gases in CVD and PECVD Reactions," which is also commonly owned with the present application. Both the issued patent and pending application are completely incorporated herein by reference in their entireties.

The ground reference for the parallel plate device is generally the metal processing chamber in which the electrodes are disposed. The substrate support electrode may or may not be grounded as well. An insulator, in the form of a plate of insulative material (e.g. quartz) is positioned between the grounded chamber and the showerhead electrode. The electrodes and insulator plate are usually flat, planar structures, although they may have some curvature to them. Since the process gas is passed to the showerhead electrode, it is necessary for the gas to pass through the insulator plate. However, the holes or openings which must be formed in the insulator plate to allow gas passage to the showerhead electrode, may be detrimental to the stability of the plasma.

More specifically, the openings through the insulator provide a plasma breakdown path between the biased RF electrode and the grounded processing chamber. The plasma breakdown occurs when plasma is formed within the openings and creates an electrically conductive path between the RF showerhead electrode and a ground reference, such as the chamber lid or some other portion of the processing chamber. The plasma will then have a tendency to arc to ground, which detrimentally affects the stability of the plasma and, as a result, the stability of the plasma process. The plasma breakdown usually occurs at a particular RF power level and system pressure and thus limits the RF power that may be applied to the plasma discharge. The limitation of plasma power will reduce the density of the plasma. The relationship between the breakdown power and the gas pressure is determined by various system parameters, such as the dimension of the processing chamber, the RF frequency, and the type of process gas utilized.

An additional drawback to the existence of a breakdown plasma in the insulator openings occurs when the processing system is utilized for PECVD. In such a case, a plasma discharge in the openings may lead to deposition of a conductive coating therein. This may further lead to plasma instability and is a problem even under processing conditions where plasma arcing and breakdown does not actually occur.

Some techniques have been employed to prevent a plasma breakdown; however, such techniques generally complicate the fabrication of the plasma processing system, and thus increase the overall expense of the system. For example, the insulator plate may be made thicker to increase the lengths of the openings in the plate. Furthermore, the openings may be profiled with grooves or flutes to lengthen the effective path length through the openings. Still further, the openings might be angled to also lengthen the effective path length through the openings. Such techniques increase the complexity of the insulator plate construction, and therefore, increase the fabrication costs of the plate.

Another solution to the problem of breakdown voltage is to maintain the pressure in the processing chamber within a range that will allow a higher amount of RF power to be delivered to the plasma without breakdown. However, such a limitation also limits the operation of the parallel plate device and its applications in plasma processing.

Accordingly, it is an objective of the present invention to maintain a stable plasma within a parallel plate discharge device over a wide range of process conditions and pressures.

To that end, It is another objective of the invention to reduce and prevent plasma breakdown within a parallel plate device using an insulator between the showerhead electrode and the ground reference.

It is still another objective of the invention to reduce and prevent plasma breakdown within a parallel plate device without increasing the overall cost and complexity of the device.

It is another objective of the invention to reduce plasma deposition of a conductive coating within the opening in an insulator plate of a parallel plate device used in a PECVD process.

SUMMARY OF THE INVENTION

The present invention addresses the above objectives and reduces plasma breakdown due to conduction through openings formed in an insulator element for passing process gas from a process gas supply to a biased gas-dispersing element such as a showerhead electrode. In that way, the present invention maintains an electrically stable plasma for processing a substrate. To that end, the processing system of the invention comprises a processing chamber defining a process space which includes a support structure therein for supporting a substrate. A gas inlet in the chamber is coupled to a process gas supply for introducing the process gas into the chamber proximate a substrate supported therein. A gas-dispersing element, such as a showerhead, is also coupled to the process gas supply for dispersing process gas proximate a substrate.

In accordance with the principles of the present invention, an insulator assembly is positioned between the showerhead and the processing chamber and is operable to electrically insulate the showerhead from the processing chamber. The insulator assembly includes a passage therethrough for passing a process gas from the gas inlet through the insulator assembly wherein the passage includes sections laterally spaced from each other to prevent a direct line-of-sight opening through the assembly. A cross passage section extends between the laterally spaced passage sections to couple those passage sections together and form the complete passage through the assembly.

In one embodiment of the invention, the insulator assembly includes insulator elements, such as planar insulator plates, which are formed of an electrically insulating material, such as quartz. The insulator plates each have a passage section therethrough for passing a process gas from the gas inlet through the insulator plate. The respective passage sections of the insulator plates are laterally spaced from each other so that a direct line-of-sight opening through the insulator plates is prevented. A cross passage section is formed in at least one of the elements and extends between the spaced passage sections to couple the passage sections together and form a complete passage through the insulator plates for passing a process gas through the plates and to the showerhead. Preferably at least one 90° angle is formed between the showerhead and the processing chamber for avoiding a direct line-of-sight passage between the showerhead and chamber to thereby reduce and prevent plasma breakdown. In one embodiment of the invention, two adjacent plates are used. Alternatively, multiple plates with multiple pairs of laterally spaced passage sections and respective channels might be utilized for electrically insulating the showerhead in accordance with the principles of the present invention.

In one embodiment of the invention, four pairs of passages are formed in the insulator plates and four associated pairs of laterally spaced sections and cross passage sections are used. The plates have a generally circular cross-section and the cross passage sections are formed in a semi-circular shape to follow the contour and shape of the plates. Ceramic alignment pins are positioned between the insulator plates for providing proper alignment between the respective spaced passage sections and cross passage sections to form the various gas passages through the plates. Alignment pins might also be utilized at interfaces between the plates and the processing chamber and showerhead to ensure proper positioning and alignment of the plates within the processing chamber.

In addition to preventing plasma breakdown by eliminating a direct, line-of-sight, conductive path through the insulator plates, the present invention also may eliminate electrical insulating or RF blocking structures within the gas supply line, which are normally utilized with the processing systems to prevent the RF biasing of the electrode from traveling into the process gas supply. Furthermore, the multiple insulator plates of one embodiment of the present invention may be made thinner than the typical single insulator plates utilized in prior art processing systems. As such, the multiple plates are less susceptible to thermal shock and breakage should the heated processing space be vented to atmosphere.

Other objectives and advantages are set forth hereinbelow in the Detailed Description of the invention.

BRIEF DESCRIPTION OF THE FIGURES

The accompanying drawings, which are incorporated in and constitute a part of this specification, illustrate embodiments of the invention and, together with a general description of the invention given below, serve to explain the principles of the invention.

DETAILED DESCRIPTION

Figure 1:
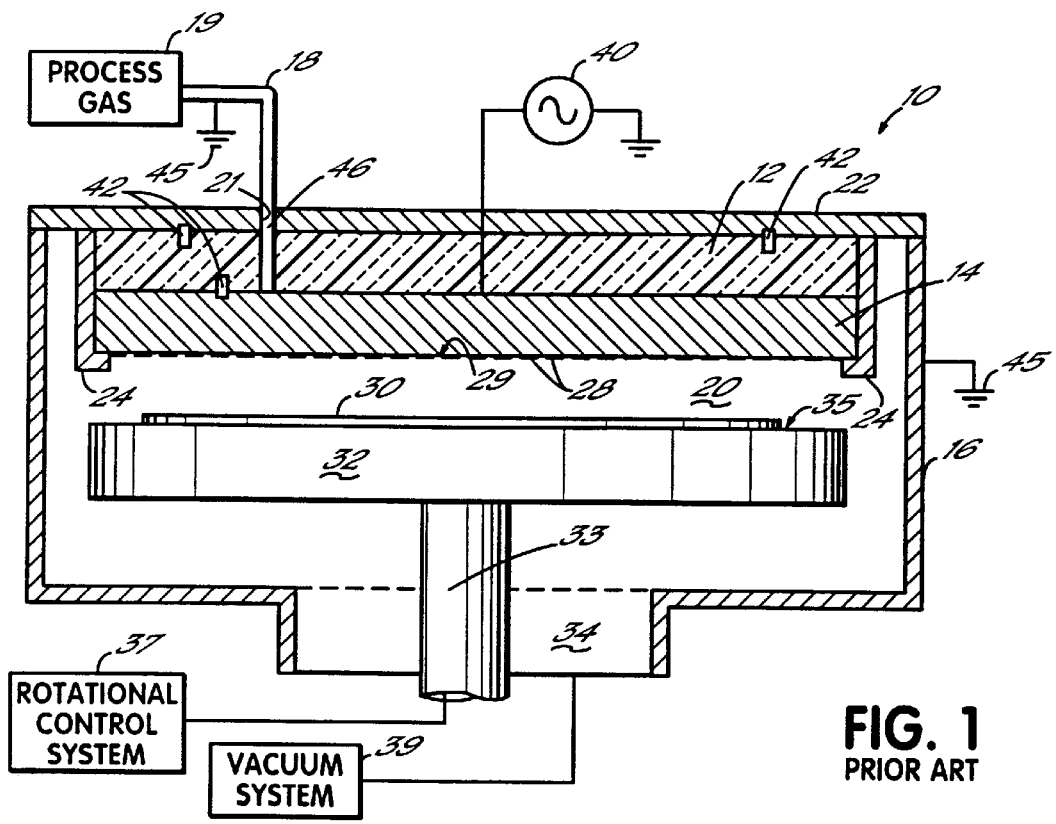
FIG. 1 is a side cross-sectional view of a prior art parallel plate device.

FIG. 1 illustrates a prior art processing system 10 utilized for processing semiconductors during IC fabrication and incorporating a parallel plate plasma discharge device. System 10 utilizes a planar insulator plate 12 through which a process gas is directed to a biased showerhead 14. As discussed above in the Background Section of the application, such a configuration is susceptible to plasma breakdown due to the process gas being passed directly through the insulator plate 12, which effectively provides a conductive plasma path between the biased showerhead 14 and the grounded process chamber 16 and/or grounded process gas supply line 18 and associated gas supply components. The drawback of plasma breakdown in existing parallel plate processing systems is addressed by the present invention, which also provides additional benefits including a plasma processing system which is more impervious to the effects of thermal shock and which may eliminate various of the gas supply components, such as RF breaks or RF blocking components which prevent the RF in the showerhead from migrating to components of the gas supply through the gas supply line.

The existing system 10 in FIG. 1 will be described in detail for an understanding of the current plasma processing system in which the present invention will be incorporated. Prior art system 10 and inventive system 10a have various common or similar components which are given similar reference numbers accordingly. System 10, in which the invention will be incorporated, includes a processing chamber 16 formed of a suitable metal such as stainless steel or Inconel. The processing chamber 16 defines a process space 20 in which a plasma is generated. Closing the top of chamber 16, and thereby enclosing the process space 20 is a chamber lid 22, which is also preferably formed of stainless steel. Chamber lid 22 is appropriately sealed with chamber 16 for providing a low pressure or vacuum environment in accordance with plasma processing principles. A support structure 24, which may be coupled to the chamber lid 22 supports the insulator plate 12 and a gas-dispersing element, such as showerhead 14 as illustrated. The insulator plate 12 will be fabricated from an electrically insulative material, such as quartz. Showerhead 14 includes a plurality of appropriately formed apertures 28 therein, in a bottom surface 29 thereof for introducing process gas above a substrate 30 resting on a substrate support or susceptor 32. The showerhead 14 may take any suitable form and is generally configured to receive process gas from a process gas supply 19 and gas supply line 18 and disperse the gas evenly over the substrate 30 through apertures 28. The pattern and number of apertures 28 are preferably determined to provide a uniform and even flow of the process gas over the substrate. Suitable showerhead designs are illustrated in U.S. Pat. No. 5,567,243 and Ser. No. 08/940,779, noted above. The showerhead is fabricated from a suitable metal such as aluminum or Inconel. The gas supply line 18 will pass through an appropriate inlet 21 formed in the chamber Susceptor 32 rests on a base 33 and supports a planar substrate 30 in an orientation generally parallel to showerhead 14. For a particular process, such as a CVD or PECVD process (or an etch process), the substrate 30 and accordingly susceptor 32, might need to be heated (or coded) and will therefore be coupled to a suitable heating or cooling system and temperature control system (not shown) through base 33. Also, it may be desirable to rotate the susceptor 32 for uniform deposition onto the substrate 30. To that end, susceptor 32 might be coupled to an external rotational control system 37. It will be readily understood by a person of ordinary skill in the art that other susceptor control systems, such as a back plane heating system and a substrate chuck or clamping system might also be utilized with susceptor 32 in accordance with well-known principles in the art. During processing, process space 20 of chamber 16 is at a low pressure, and accordingly, chamber 16 is coupled to a vacuum system 39 through an appropriate opening in the chamber 16, such as vacuum opening 34. The pressure within the process space 20 maintained by vacuum system 39 will be in accordance with known process parameters.

For creating and maintaining a plasma within the process space 20, showerhead 14 is biased by an RF power supply 40. One such suitable supply operates at approximately 13.56 MHZ and is capable of delivering power to the showerhead 14 of approximately 100–1200 Watts. Furthermore, within the parallel plate configuration of processing system 10, a small distance is maintained between the top susceptor surface 35 supporting substrate 30 and the opposing lower surface 29 of the showerhead 14. One such suitable distance is approximately 25 mm, or around 1 inch. In ensuring proper alignment of the showerhead 14 and insulator plate 12 with respect to substrate 30 and process gas supply line 18, alignment pins 42 are used in the interfaces between the chamber lid 22 and insulator plate, and between the insulator plate 12 and showerhead 14. Chamber lid 22, insulator plate 12, and showerhead 14 will all be appropriately sealed in accordance with well-known principles to ensure that a proper vacuum is sustained and that process gas is maintained within the chamber 16 and specifically within the process space 20 for providing a uniform and dense plasma proximate substrate 30.

The electrodes of the processing system 10 are formed by the generally planar and generally parallel showerhead 14 and susceptor 32. The showerhead 14 and susceptor 32 may maintain curved surfaces 29 and 35, respectively. However, the surfaces 29, 35 are preferably planar and are oriented preferably in a parallel orientation with respect to each other. As noted above, the showerhead 14 is biased by an RF power supply 40. Susceptor 32 will generally be grounded (although it may also be biased) and to that end will generally be electrically coupled to the chamber 16 which is coupled to a ground reference 45. The process gas supply, and particularly supply line 18, is also coupled to the ground reference 45. As illustrated in FIG. 1, a passage 46 is formed through insulator plate 12 and couples the gas supply line 18 to showerhead 14. Showerhead 14 will usually include a space (not shown) into which the process gas is directed for being subsequently dispersed through apertures 28. The opening 46 is appropriately coupled and sealed to the interfaces with the supply line 18 and the showerhead 14 to ensure that gas is efficiently delivered to the showerhead without leakage. For example, an O-ring seal, not shown, could be utilized between the plate 12 and the chamber lid 22 to prevent gas leakage where the supply line 18 interfaces with plate 12.

Figure 2:
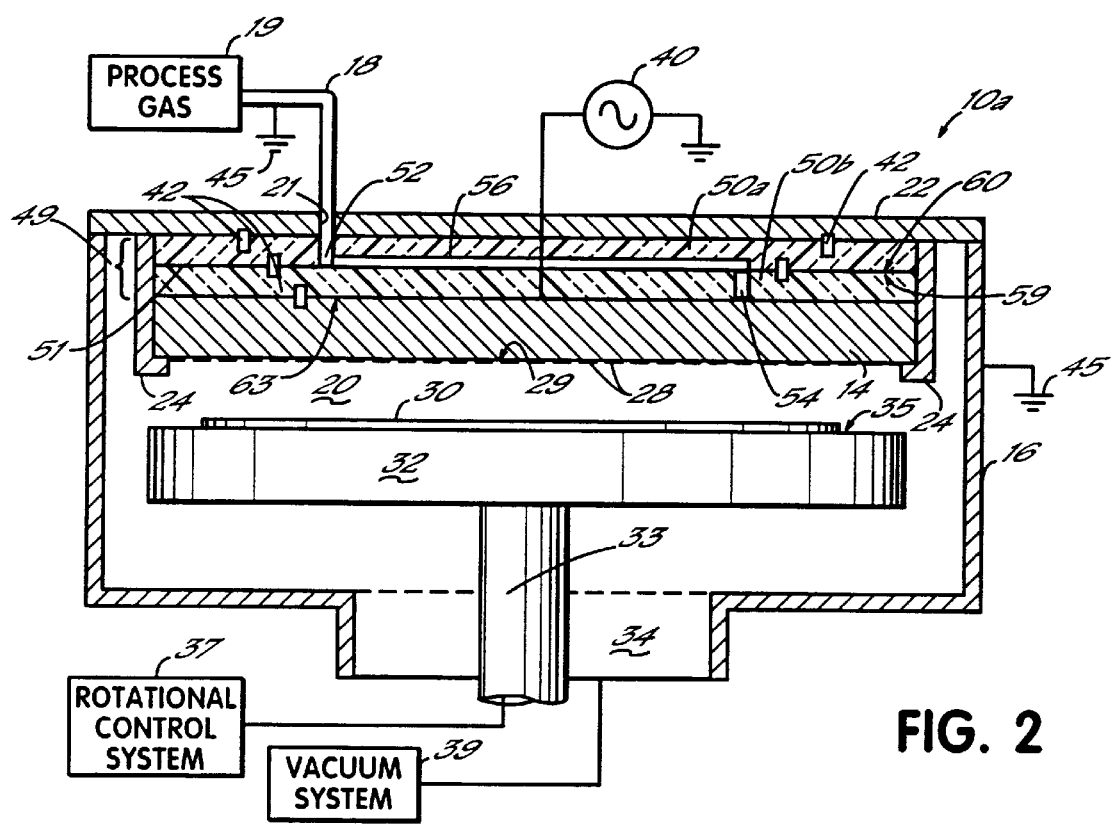
FIG. 2 is a side cross-sectional view of an insulator assembly in accordance with the principles of the present invention.

FIG. 2 illustrates the present invention which may be utilized within a processing system similar to system 10 illustrated in FIG. 1. To that end, like elements utilize the same reference numbers. The inventive system 10a illustrated in FIG. 2 utilizes an insulator assembly 49 which includes a passage therein with laterally spaced passage sections to prevent a line-of-sight gas passage between the biased showerhead and the chamber or gas lines which are grounded. The assembly, in one embodiment, includes multiple insulator elements, such as individual insulator plates 50a, 50b. The two plates 50a, 50b cooperate to reduce and prevent plasma breakdown. The assembly 49, such as the plates, is appropriately formed of an electrically insulative material such as quartz. While an assembly 49 using multiple elements is illustrated, the invention might also utilize a single element in which a passage is formed in accordance with the present invention. The process gas from supply line 18 is fed through the first insulator plate 50a through a passage section 52 and is then fed through the second plate 50b through a passage section 54. In accordance with the principles of the present invention, the passage sections 52, 54 are laterally spaced from each other so as not to provide a straight or direct line-of-sight path between the biased showerhead electrode 14 and the grounded process chamber 16 or supply line 18. The passage sections 52, 54 are coupled together by a cross passage section 56 formed in at least one of the elements or plates 50a, 50b between the spaced passage sections. The spaced passage sections 52, 54 and the cross passage section 56 collectively form the passage through the insulator assembly 49. In the embodiment illustrated in FIG. 2, the cross passage section 56 is formed completely in the upper element 50a; however, the cross passage section 56 might also be formed in element 50b, or might be formed with portions in both elements 50a, 50b. Therefore, the path the process gas travels between the biased showerhead electrode 14 and the process chamber 16 or gas feedline 18, is significantly lengthened and there is no direct, line-of-sight course of travel for the plasma to short to a ground reference. In a preferred embodiment of the invention, cross passage section 56 will have the same or larger cross-sectional dimension as the passage sections 52, 54 in order to minimize or prevent gas flow restriction. As illustrated in FIG. 2, the flow of the plasma in the passage sections 52, 54 and cross passage section 56 will encounter at least two right angles or 90° turns formed at the interface between the passage sections 52, 54 and the section 56. The plates 50a, 50b are formed and configured to stack together so that the interface 51 between the plates provides a generally gas-tight coupling of the passage sections 52, 54 and section 56.

The passage sections 52, 54 within the stacked insulator plates 50a, 50b may be positioned in the plates as desired in order to address the particular geometry and design considerations of the processing system 10a. In one embodiment of the invention, the showerhead 14 and plates 50a, 50b are circular and the section 56 follows the circular geometry of the plate in which it is formed. Furthermore, multiple gas supply lines 18 might be utilized to introduce gas to the showerhead. In such an embodiment of the invention, pairs of appropriately formed passage sections 52, 54 and respective cross passage section 56 would be used in the plates 50a, 50b. To provide alignment between the various insulator plates 50a, 50b the chamber lid 22 and showerhead 14, alignment pins 42 may be utilized as appropriate. In the preferred embodiment, the alignment pins are preferably ceramic.

Figure 4A:
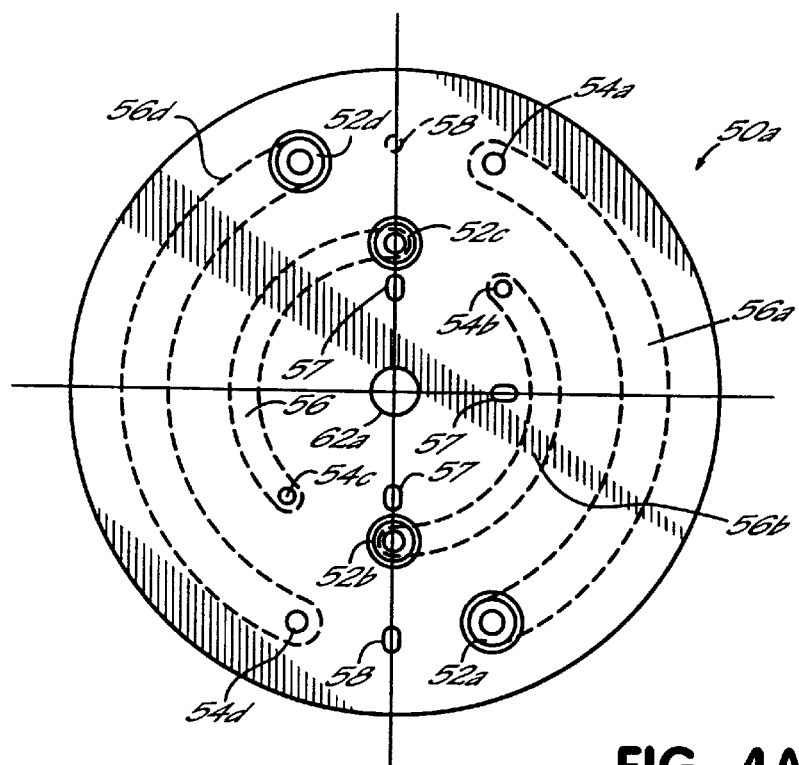
FIG. 4A is an upper view of an insulator plate used in an insulator assembly in accordance with the principles of the present invention.
Figure 4B:
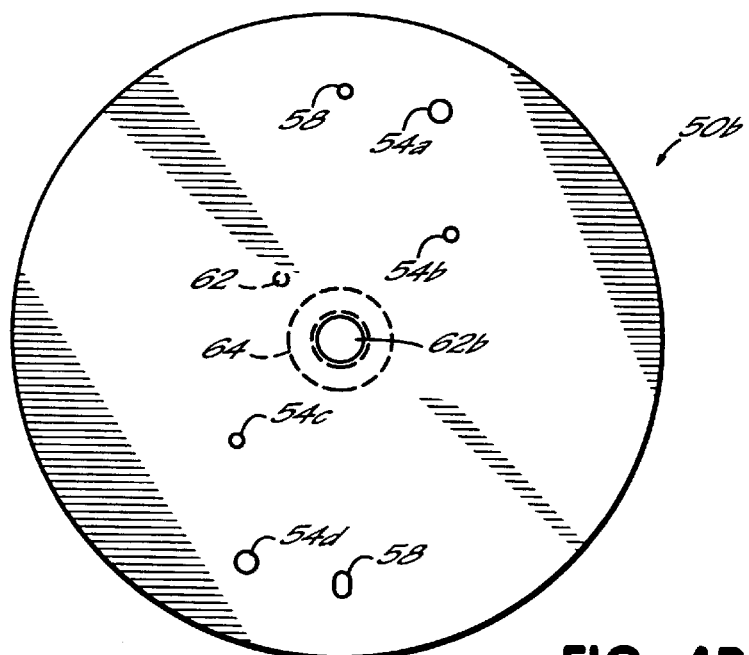
FIG. 4B is a lower view of an insulator plate, as in FIG. 4A, in accordance with the principles of the present invention.

FIGS. 4A and 4B illustrate an embodiment of upper and lower insulator plates 50a, 50b in accordance with one embodiment of the present invention. The insulator plates include multiple pairs of laterally spaced passage sections with an associated cross passage section formed between the pairs of spaced passage sections. In that way, multiple gas supply lines may be utilized to deliver gas to showerhead 14 and multiple passages are formed through the insulator assembly. More specifically, the insulator plates 50a, 50b are generally circular in cross-section and include pairs of passage sections designated as 52a, 54a; 52b, 54b; 52c, 54c and 52d, 54d. Respective cross passage sections 56a, 56b, 56c, and 56d couple the pairs of passage sections together. The cross passage sections are formed in a semi-circular shape to match the cross-sectional shape of the plates 50a, 50b. In the embodiment illustrated in FIGS. 4A and 4B, the outer passage sections 56a, 56d, and corresponding pairs of spaced passage sections 52a, 54a and 52d, 54d are larger than the inner passage sections 56b and 56c and associated spaced passage sections.

The assembly of FIGS. 4A, 4B therefore may be utilized to introduce multiple process gases to a showerhead. For example, one process gas supply might be coupled to the inner passages of the assembly, while another supply with a different process gas may be coupled to the outer passages. A non-mixing showerhead, as illustrated in application Ser. No. 08/940,779, which is incorporated herein by reference, may be used with the insulator assembly of the invention.

Appropriate holes 57 are formed in the top surface of the top or upper plate 50a to receive ceramic alignment pins 42 between the interface of insulator plate 50a and the chamber lid 22. Similarly, appropriate openings 58 are formed in both the lower face 59 of the upper plate 50a and the upper face 60 of the lower plate 50b for receiving alignment pins 42 at the interface 51 between the plates. Finally, an appropriate opening 62 is formed in a lower surface 63 of the lower plate 50b for an alignment pin coupled between the showerhead 14 and the lower insulator plate 50b.

To bias a showerhead, RF energy must be coupled thereto through the insulator assembly. To that end, the insulator assembly 49 includes an RF aperture formed therein. Referring to FIGS. 4A, 4B, apertures 62a, 62b are formed in the plates to create an overall RF aperture. A metal plate or washer 64 might be utilized with the element 50b for physically coupling the showerhead to the insulator assembly.

Figure 3:
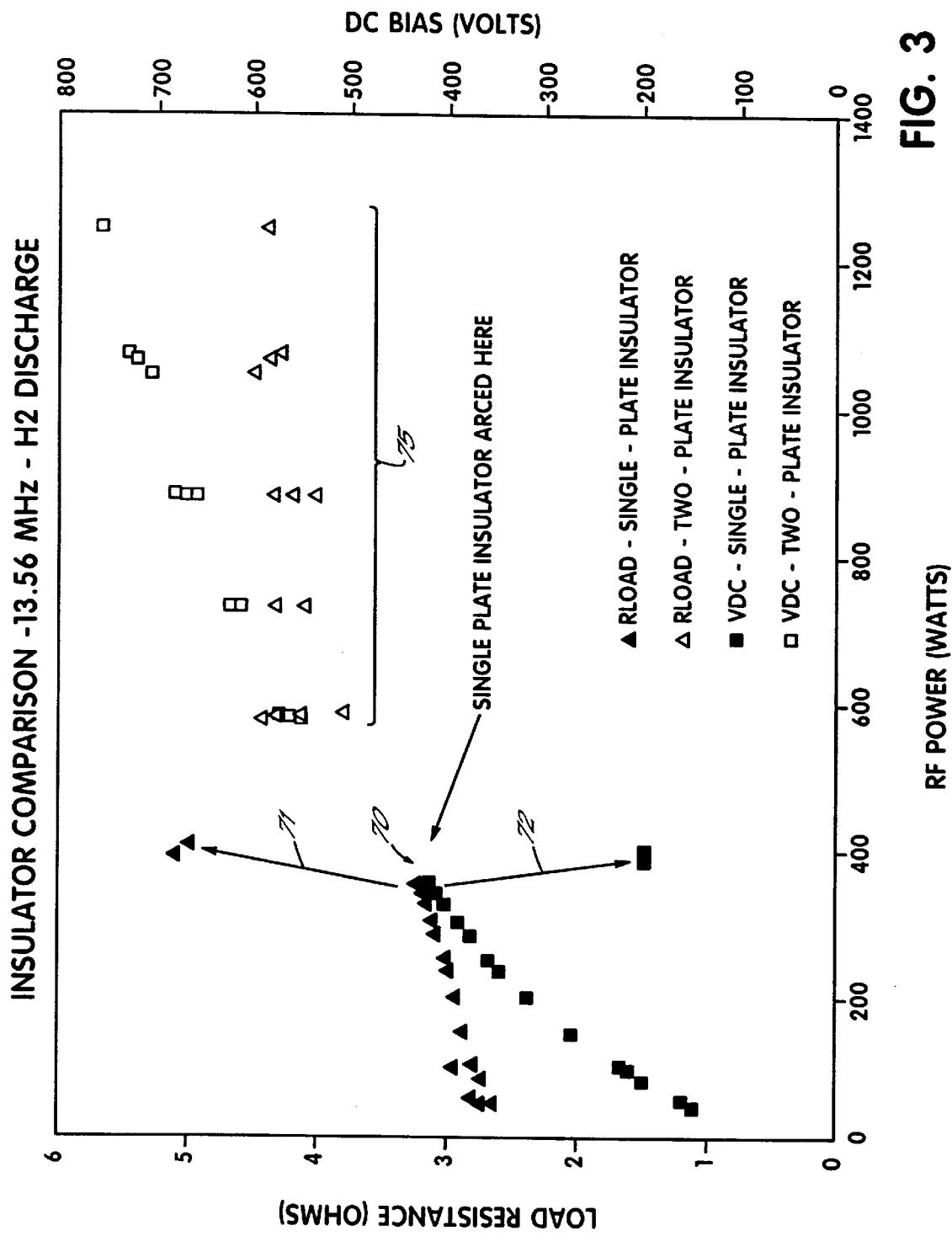
FIG. 3 is a diagram plotting the DC bias of an RF electrode in the load resistance of a hydrogen plasma plotted versus RF power for the devices shown in both FIGS. 1 and 2.

FIG. 3 illustrates a graph of the load resistance of the plasma discharge created within the process systems 10 and 10a, and the DC self-bias of the RF biased showerhead versus RF power for a system using a hydrogen plasma and a single insulator plate as shown in FIG. 1 and the insulator assembly 49 with insulator plates 50a, 50b as shown in FIGS. 2, 4A and 4B. As illustrated by the various points on the chart of FIG. 3, at an RF frequency of 13.56 MHz and process pressure of 0.45 Torr, within space 20 of the chamber 16, the RF power delivered to system 10 was generally limited to 350 Watts. The process space was maintained at a temperature of around 175–200° C. As illustrated at point 70 in the chart of FIG. 3, and the reference arrows 71,72 at power levels above approximately 350 Watts, there is an abrupt increase in the load resistance as illustrated by reference arrow 71 and a sharp drop in the DC self-bias of the showerhead as illustrated by reference numeral 72. The abrupt increase in load resistance of the plasma and abrupt drop in showerhead DC bias is indicative of a parasitic discharge formation in the passage 46 through the insulator plate 12 wherein the showerhead 14 begins to arc to ground through the plasma. Plasma within the showerhead was confirmed within a CVD process using system 10, as deposition occurred in the individual passages or holes 28 of the showerhead 14. Generally, the RF power limit of the system 10 will increase upon an increase in pressure within the processing space 20 because, at higher pressures, the RF voltage at the showerhead necessary for delivering a particular RF power to the plasma is lower.

Reference number 75 refers to points in the chart of FIG. 3 wherein system 10a in accordance with the present invention was utilized having two stacked insulator plates 50a, 50b as shown in FIGS. 4A and 4B. With the inventive design of system 10a there was effectively no power limit observed up to 1300 Watts.

In accordance with the principles of the present invention as noted above, multiple gas supply lines 18 might be utilized to introduce the process gas to showerhead 14. Furthermore, in accordance with the principles of the present invention, multiple insulator plates beyond the two stacked insulator plates 50a, 50b illustrated in FIG. 2 might be utilized. For example, for higher power levels within a desired process, the cross passage section 56 may require a very short length. As such, passage section 56 may be replaced with a series of shorter passage sections formed at the interface of more than two multiple plates. In that way, the invention also comprises embodiments using any number of stacked insulator plates with appropriate channels formed at each interface between the plates and the appropriate laterally-spaced and non-aligned gas passages formed in the plates to provide a passage for the process gas between one or more gas feedlines 18 and the showerhead 14.

The present invention provides a long path length between the RF electrode and a ground reference in order to defeat plasma breakdown. Furthermore, the laterally-spaced and non-aligned passage sections 52, 54 coupled by passage section 56 prevent a direct line-of-sight between the showerhead electrode and a ground reference in order to impede any secondary electron avalanche which may occur upon the plasma breakdown. The system 10a of the present invention is also less susceptible to thermal shocks because multiple thinner plates are less susceptible to breakage than a single thick plate should the system have to be vented to atmosphere at a high temperature. The further advantage to the system 10a of the present invention is the elimination of certain gas supply elements which leads to a less complicated gas delivery system. For example, since there is no direct, line-of-sight connection of the gas supply line 18 to the showerhead electrode 14, it is not necessary to utilize separate RF-break components within the gas supply line 18 as might normally be necessary in system 10 illustrated in FIG. 1.

While the present invention has been illustrated by the description of the embodiments thereof, and while the embodiments have been described in considerable detail, it is not the intention of the applicant to restrict or in any way limit the scope of the appended claims to such detail Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A processing system for processing a substrate with a plasma, the processing system comprising:

a processing chamber defining a process space, the processing chamber including a support structure for supporting a substrate within the process space;

a gas inlet in the chamber for introducing a process gas into the chamber;

a showerhead positioned within the chamber and operable for dispersing process gas from the inlet into the process space;

a supply of electrical energy for biasing the showerhead to form a plasma with process gas dispersed by the showerhead;

an insulator assembly contacting the showerhead and positioned between the showerhead and the processing chamber, the insulator assembly operable to electrically insulate the showerhead from the processing chamber;

the insulator assembly including a passage therethrough for passing a process gas from the gas inlet through the insulator assembly, the passage including sections thereof which are laterally spaced from each other;

the passage further including a cross passage section extending between the laterally spaced passage sections to couple the laterally spaced passage sections together and form a passage through the insulator assembly for passing a process gas to the showerhead;

whereby a direct line-of-sight passage through the insulator assembly is avoided to maintain the stability of the plasma during processing.

2. The processing system of claim 1 wherein the insulator assembly includes first and second electrical insulator elements, each element including a passage section extending therethrough for passing a gas through the insulator element, the respective passage sections of the insulator elements being laterally spaced from each other, the cross passage section being formed in at least one of the elements and extending between the spaced passage sections to couple the passage sections together and form the complete passage.

3. The processing system of claim 2 wherein the cross passage section is formed completely in one element.

4. The processing system of claim 1 wherein said insulator assembly is formed of quartz.

5. The processing system of claim 1 wherein said supply of electrical energy is an RF power supply for biasing the showerhead with RF energy.

6. The processing system of claim 2 wherein said insulator elements are planar insulator plates which are stacked one on the other.

7. The processing system of claim 6 further comprising alignment pins positioned between the insulator plates for providing proper alignment between the respective passage sections and the cross passage section to form said passage.

8. The processing system of claim 1 wherein said passage forms at least one 90 degree angle between the showerhead and the chamber for the flow of a process gas.

9. The processing system of claim 1 wherein the insulator assembly further comprises multiple passages therethrough, each of the passages including a pair of laterally spaced passage sections with a cross passage section coupling the spaced passage sections together.

10. The processing system of claim 9 wherein the multiple passages are physically isolated from each other.

11. The processing system of claim 1 wherein said cross passage section is semi-circular in shape.

12. The processing system of claim 6 wherein said insulator plates each form a plane and said laterally spaced passage sections are oriented generally perpendicular to said plate planes, the cross passage section being oriented generally parallel to said plane of the plate in which it is formed.

13. A processing system for processing a substrate with a plasma, the processing system comprising:

a processing chamber defining a process space, the processing chamber including a support structure for supporting a substrate within the process space;

a gas inlet in the chamber for introducing a process gas into the chamber;

a showerhead positioned within the chamber and operable for dispersing process gas from the inlet into the process space;

a supply of electrical energy for biasing the showerhead to form a plasma with process gas dispersed by the showerhead;

an insulator assembly positioned between the showerhead and the processing chamber, the insulator assembly contacting the showerhead and operable to electrically insulate the showerhead from the processing chamber and comprising a plurality of electrical insulator elements positioned adjacent to each other between the showerhead and the processing chamber;

each of said plurality of insulator elements having a passage section therethrough for passing a process gas from the gas inlet through the insulator element, the respective passages of the adjacent insulator elements being laterally spaced from each other;

at least one cross passage section extending between the laterally spaced passage sections of adjacent insulator elements to couple the laterally spaced passages together for passing a process gas through the adjacent insulator elements;

whereby a direct line-of-sight passage through the insulator assembly is avoided to maintain the stability of the plasma during processing.

14. An electrically insulative assembly for insulating a biased gas-dispersing element from a ground reference within a processing system for processing a substrate with a plasma, the insulative assembly comprising:

a processing chamber defining a process space, the processing chamber including a support structure for supporting a substrate within the process space;

an electrical insulator assembly configured to be positioned between a biased gas-dispersing element and a ground reference to electrically insulate the gas-dispersing element;

the insulator assembly configured for contacting the gas-dispersing element and including a passage therethrough for passing a process gas from the gas inlet through the insulator assembly, the passage including sections thereof which are laterally spaced from each other;

the passage further including a cross passage section extending between the laterally spaced passages to couple the laterally space passage sections together and form a complete passage through the insulator assembly for passing a process gas to a gas-dispersing element;

whereby a direct line-of-sight passage through the insulator assembly is avoided to maintain the stability of the plasma during processing.

15. The assembly of claim 14 wherein the insulator assembly includes first and second electrical insulator elements, each element including a passage section extending therethrough for passing a gas through the insulator element, the respective passage sections of the insulator elements being laterally spaced from each other, the cross passage section being formed in at least one of the elements and extending between the spaced passage sections to couple the passage sections together and form the complete passage.

16. The assembly of claim 14 wherein said insulator assembly is formed of quartz.

17. The assembly of claim 14 wherein said insulator elements are planar inslulator plates which are stacked one on the other.

18. The assembly of claim 14 wherein said passage forms at least one 90 degree angle for the flow of a process gas through the insulator assembly.

19. The assembly of claim 14 wherein the insulator assembly further comprises multiple passages therethrough, each of the passages including a pair of laterally spaced passage sections with a cross passage section coupling the spaced passage sections together.

* * * * *

UNITED STATES PATENT AND TRADEMARK OFFICE
CERTIFICATE OF CORRECTION

PATENT NO. : 6,173,673 B1
DATED : January 16, 2001
INVENTOR(S) : Golovato et al.

It is certified that error appears in the above-identified patent and that said Letters Patent is hereby corrected as shown below:

<u>Column 9,</u>
Line 39, sentence needs period after such detail.

<u>Column 10,</u>
Line 66, reads" an insulator assembly positioned between the showerhead and the processing chamber, the insulator assembly contacting the showerhead and operable" and should read -- an insulator assembly contacting the showerhead and positioned between the showerhead and the processing chamber, the insulator assembly operable --.

Signed and Sealed this

Fifth Day of March, 2002

*Attest:*

*Attesting Officer*

JAMES E. ROGAN
*Director of the United States Patent and Trademark Office*